(12) United States Patent
Chapman

(10) Patent No.: US 6,517,669 B2
(45) Date of Patent: *Feb. 11, 2003

(54) APPARATUS AND METHOD OF DETECTING ENDPOINT OF A DIELECTRIC ETCH

(75) Inventor: James Malden Chapman, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/261,601

(22) Filed: Feb. 26, 1999

(65) Prior Publication Data

US 2002/0084253 A1 Jul. 4, 2002

(51) Int. Cl.⁷ .............................................. H01L 21/306
(52) U.S. Cl. ................................ 156/345.25; 250/338.4
(58) Field of Search ........................... 156/345, 345.25; 250/338.14; 216/83, 86

(56) References Cited

U.S. PATENT DOCUMENTS

| | | | | |
|---|---|---|---|---|
| 4,793,895 A | * | 12/1988 | Kaanta et al. | 438/17 |
| 4,812,756 A | * | 3/1989 | Curtis et al. | 324/750 |
| 4,878,017 A | * | 10/1989 | Williams | 324/109 |
| 5,151,584 A | | 9/1992 | Ebbing et al. | 250/201.4 |
| 5,198,072 A | * | 3/1993 | Gabriel | 216/59 |
| 5,362,356 A | | 11/1994 | Schoenborn | 156/626 |
| 5,458,732 A | | 10/1995 | Butler et al. | 216/61 |
| 5,498,974 A | * | 3/1996 | Verkuil et al. | 324/767 |
| 5,504,328 A | | 4/1996 | Bonser | 250/288 |
| 5,665,166 A | * | 9/1997 | Deguchi et al. | 118/723 E |
| 6,005,246 A | * | 12/1999 | Kitamura et al. | 250/306 |
| 6,011,404 A | * | 1/2000 | Ma et al. | 324/765 |
| 6,097,196 A | * | 8/2000 | Verkuil et al. | 324/750 |

FOREIGN PATENT DOCUMENTS

| | | | |
|---|---|---|---|
| JP | 3-74843 | * | 3/1991 |
| JP | 05251398 A | * | 9/1993 |
| JP | 07086383 | * | 3/1995 |

* cited by examiner

Primary Examiner—Gregory Mills
Assistant Examiner—Sylvia R. MacArthur
(74) Attorney, Agent, or Firm—Schwegman, Lundberg, Woessner & Kluth, P.A.

(57) ABSTRACT

A system detects the clearing of a dielectric at a plurality of contact sites by measuring the surface voltage of the dielectric and comparing the surface voltage to a reference voltage set to a value that relates to the cleared contact sites. Another system detects the clearing of a dielectric at a plurality of contact sites on a substrate by measuring the rate of change of a substrate current during an etch process and ending the etch process when the rate of change is approximately zero. Another system detects the clearing of a dielectric at a contact site by measuring a substrate current during an etch process and ends the etch process when the measured substrate current exceeds a predetermined value.

25 Claims, 8 Drawing Sheets

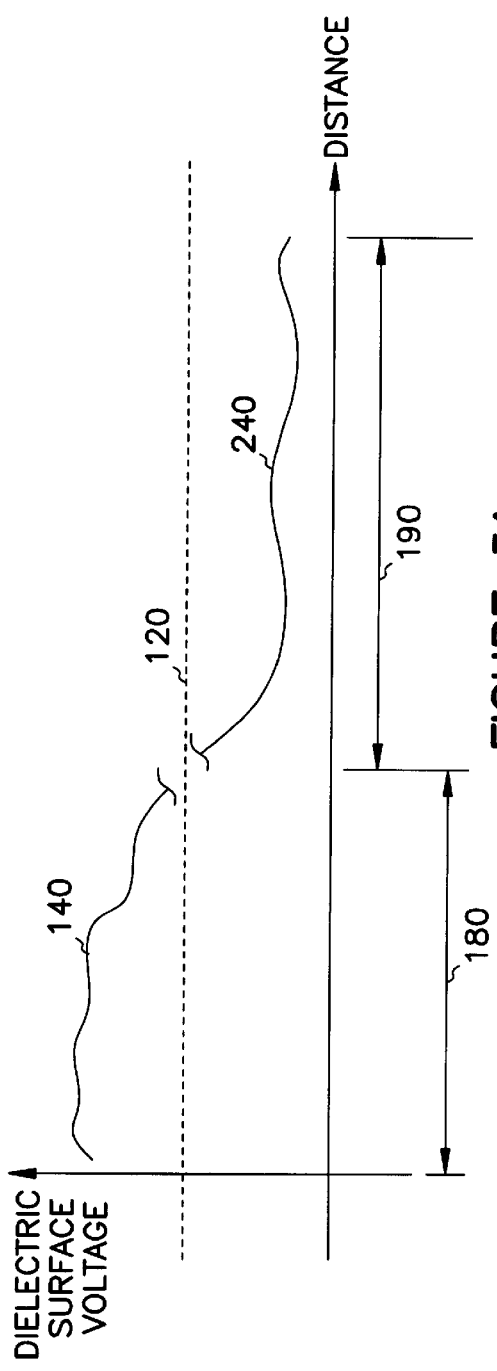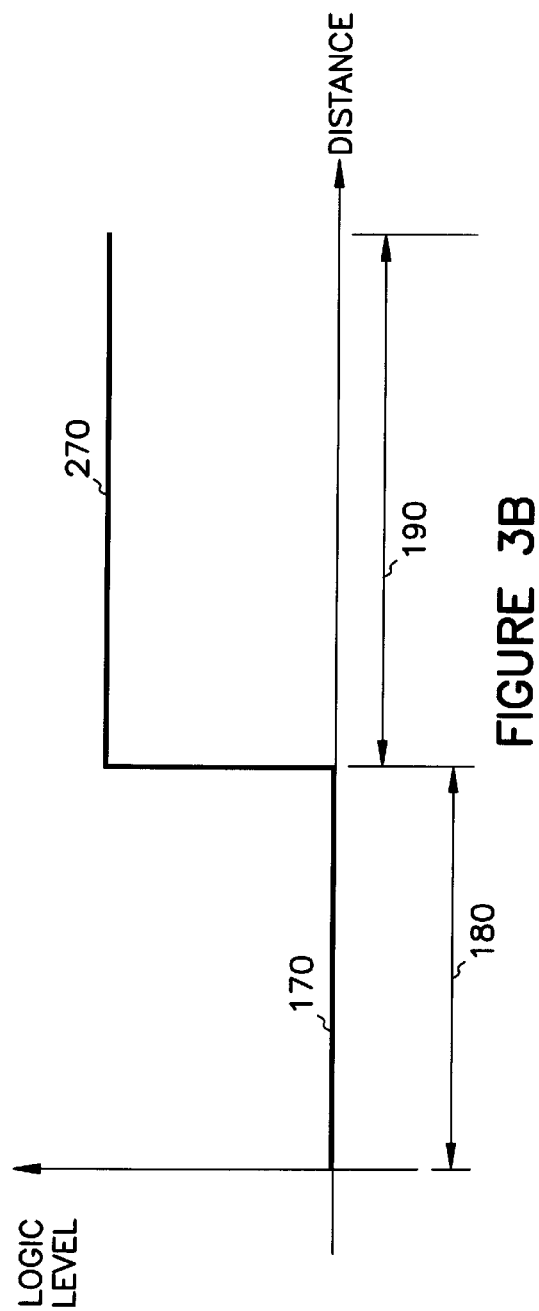

APPARATUS AND METHOD OF DETECTING ENDPOINT OF A DIELECTRIC ETCH

TECHNICAL FIELD OF THE INVENTION

This invention relates to the field of semiconductor manufacturing, and more particularly, to the field of etching dielectrics.

BACKGROUND OF THE INVENTION

Types of dielectrics used in semiconductor manufacturing include oxides, nitrides, borophosphosilicate glasses (BPSG), silicon-dioxides, silicon-nitrides, and tetra-ethyl-ortho-silicates (TEOS). During an integrated circuit manufacturing process, these dielectrics are often etched. For example, insulating oxides are etched, protective oxides are etched, and sacrificial oxide masks are etched. Dielectrics sometimes function as insulators to isolate one level of conductors and devices from another. However, the conductors and devices on different levels must be interconnected in order to have a working integrated circuit. This is accomplished by etching holes in the dielectric layers in order to connect one layer to another. In the art of integrated circuit manufacturing, these etched holes are referred to as contacts or vias. In this document, all holes etched in a dielectric are referred to simply as contacts.

A long standing problem in the art of manufacturing integrated circuits is that of completing a process step and not knowing whether the process step completed successfully. If the step did not complete successfully, and the processing of the integrated circuit continues, then it is likely that at the end of the manufacturing process the circuit will not work as designed. Thus, continued processing after a failed process step results in wasting the costs of processing after the failed step.

In the etching of dielectrics, a problem that can cause a processing step to fail is the failure of the process to completely etch the dielectric at a contact location. This failure prevents devices from being connected. One approach to solving this problem is to design the etching process to over etch, i.e., to run the process longer than necessary for etching some contacts in order to completely etch all contacts on the substrate. One difficulty with this approach is that over etching results in some contacts being etched to dimensions larger than necessary, and this interferes with the important goal of integrated circuit manufacturing of increasing the density of the devices on a substrate.

For these and other reasons, there is a need for the present invention.

SUMMARY OF THE INVENTION

The present invention provides a system and method for overcoming the problems as described above and others that will be readily apparent to one skilled in the art from the description of the present invention below.

A system in accordance with one embodiment of the present invention for use in identifying the successful completion of a dielectric etching process on a semiconductor substrate includes a voltage probe for measuring the surface voltage of the dielectric, a selectable reference voltage, and a comparator. The selectable reference voltage is set to a value related to the surface voltage of the dielectric when the contacts are cleared of the dielectric. The comparator is coupled to the selectable reference voltage and the voltage probe. The comparator compares the measured voltage to the selectable reference voltage and produces an endpoint detection signal.

In one embodiment of the system, the voltage probe is a non-contact probe. In another embodiment of the system, the selectable reference voltage is set to a value approximately equal to the surface voltage of the dielectric when the contacts are cleared of the dielectric. In still another embodiment, the comparator is an analog comparator, and in yet another embodiment, the comparator is a digital comparator.

A method in accordance with one embodiment of the present invention for identifying the completion of a dielectric etching process on a semiconductor substrate includes the steps of setting a selectable reference voltage to a value related to the surface voltage of the dielectric when a contact is cleared of the dielectric, measuring the surface voltage of the dielectric, comparing the measured voltage to the selectable reference voltage, and identifying the successful completion of the dielectric etching process by noting when the measured voltage is less than the selectable reference voltage.

In one embodiment of a method of the present invention, the selectable reference voltage is set to a value of approximately equal to the surface voltage of the dielectric when the contacts are cleared of the dielectric. In another embodiment, measuring the surface voltage of the dielectric consists of averaging multiple measurements of the surface voltage of the dielectric.

A method for etching a dielectric on a semiconductor substrate in a plasma etch system is also described. The method includes placing a substrate with a dielectric to etch within a plasma etch chamber, setting a selectable reference voltage to a value related to the surface voltage of the dielectric when the contact is cleared of the dielectric, etching the dielectric in the plasma etch chamber, measuring the surface voltage of the dielectric, generating an endpoint detection signal when the measured voltage is less than the selectable reference voltage, detecting the endpoint detection signal, and stopping the etching when the endpoint detection signal is detected.

In one embodiment of this method, the selectable reference voltage is set to a value approximately equal to the surface dielectric voltage when the contact is cleared of the dielectric.

In another embodiment, a method for etching a dielectric on a semiconductor substrate in a plasma etch system includes placing a substrate with a dielectric to etch within a plasma etch chamber, setting a selectable reference current to a value related to the substrate current when the contact is cleared of the dielectric, etching the dielectric in the plasma etch chamber, measuring the substrate current, generating an endpoint detection signal when the measured current is greater than the selectable reference current, detecting the endpoint detection signal, and stopping the etching process when the endpoint detection signal is detected.

BRIEF DESCRIPTION OF THE DRAWINGS

FIG. 3A is a graph showing the relationship between the dielectric surface voltage and the selectable reference voltage for an area of a semiconductor substrate that has not been completely etched and an area of the semiconductor substrate that has been completely etched.

FIG. 3B is a graph showing the endpoint detection signal in an unetched area and an etched area.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Embodiments of systems and methods in accordance with the present invention shall be described with reference to FIGS. 1–8. The embodiments of the systems and methods of the present invention for identifying the completion of a dielectric etching process on a semiconductor substrate are useful whenever contacts are etched in a dielectric, and determining whether the contacts are cleared of the dielectric is desired. Embodiments of the present invention can also be used in connection with processes that make use of protective oxides, sacrificial oxides, nitrides, borophosphosilicate glasses (BPSG), silicon-dioxides, silicon-nitrides, and tetra-ethyl-ortho-silicates (TEOS).

Figure 1:
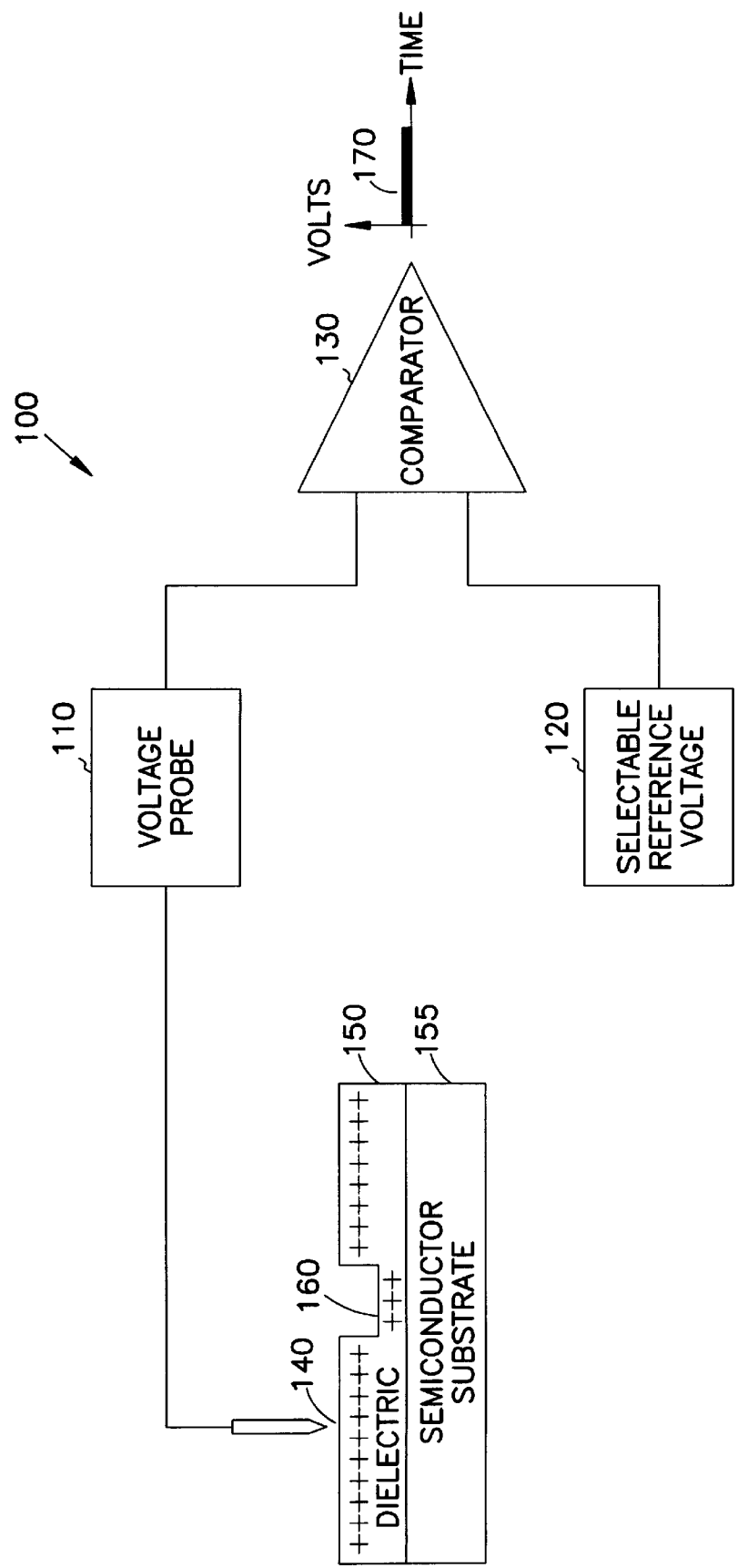
FIG. 1 is a block diagram of a system in accordance with the present invention in which the contact dielectric etching is incomplete.

As shown in FIG. 1, in one embodiment of the present invention system 100 comprises voltage probe 110, selectable reference voltage 120, and comparator 130.

Voltage probe 110 measures surface voltage 140 of dielectric 150 on semiconductor substrate 155 after a dielectric etching process. As one skilled in the art will recognize, any device that can sense surface voltage 140 of dielectric 150 is suitable for use in the present invention. In one embodiment, a non-contact Kelvin Probe is used to sense surface voltage 140. A Kelvin Probe is a non-contact, non-destructive vibrating capacitor device used to measure the work function difference, or for non-metals, the surface potential, between a conducting specimen and a vibrating tip. Kelvin Probes are known to practitioners in the art of integrated circuit manufacturing.

A reference voltage, such as selectable reference voltage 120 is set to a value that corresponds to surface voltage 140 of dielectric 150 when contact site 160 is cleared of the dielectric during an etching process. The precise value for a given manufacturing step can be determined by measuring surface voltage 140 of dielectric 150 at the completion of a dielectric etching process and then verifying that contact site 160 is cleared of the dielectric using a scanning electron microscope. The precise value of the selectable reference voltage can depend on the physical parameters of the etching process, such as the initial depth of dielectric 150, the number of contact sites 160 in dielectric 150, and the aggressiveness of the etching process. In a typical process, with a dielectric thickness of one thousand angstroms, selectable reference voltage 120 can have a value of between one-half volt and two volts.

Comparator 130, in one embodiment, is coupled to voltage probe 110 and selectable voltage reference 120 for the purpose of generating endpoint detection signal 170 shown as a time-voltage magnitude graph. Comparator 130, in one embodiment, is an analog device with an analog output, and compares the voltage measured by voltage probe 110 with selectable reference voltage 120. Endpoint detection signal 170 indicates whether the voltage measured by voltage probe 110 is greater than or less than selectable reference voltage 120. In an alternate embodiment, comparator 130 is an analog integrated circuit comparator. In another embodiment, comparator 130 is a digital comparator. In still another embodiment, comparator 130 is a person who compares the surface voltage indicated by voltage probe 110 to selectable voltage reference 120. The digital comparator can be implemented in a microprocessor, as a combination of hardware and software, or strictly in hardware. An analog comparator is preferable when voltage probe 110 and selectable reference voltage 120 generate analog voltage output signals, a digital comparator is preferable when selectable reference voltage 120 and voltage probe 110 generate digital output signals, and a human comparator is preferable when voltage probe 110 provides a visual displays of the voltages or a visual display of the relationship between the voltages.

Figure 2:
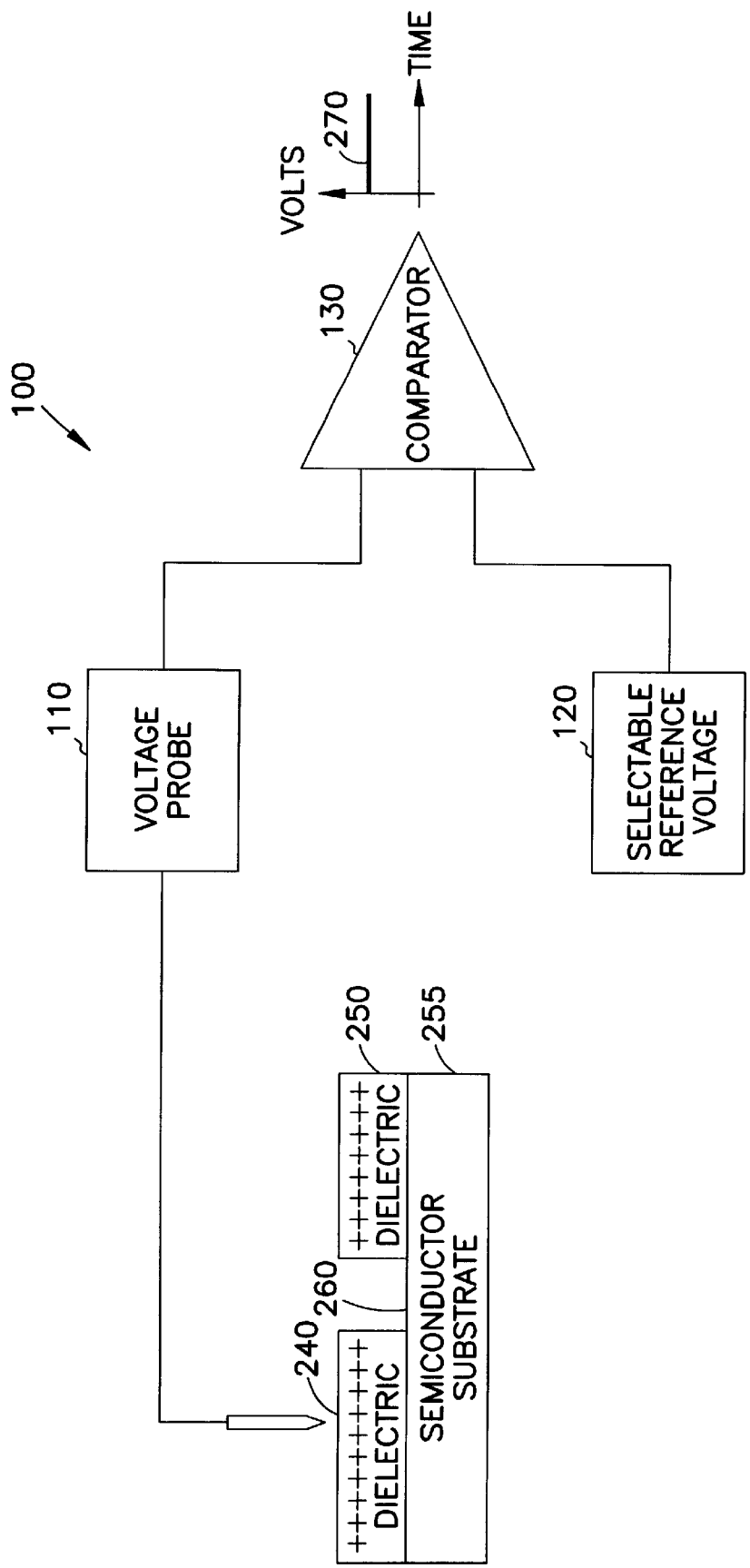
FIG. 2 is a block diagram of a system in accordance with the present invention in which the contact dielectric etching is complete.

FIG. 2 shows the system of FIG. 1 with like components labeled with like reference numerals. A difference between FIG. 1 and FIG. 2 is that in FIG. 1 contact site 160 is not cleared of the dielectric, while in FIG. 2 contact site 260 is cleared of the dielectric. Another difference is that surface voltage 240 of FIG. 2 has a value different from the value of surface voltage 140 of FIG. 1. Still another difference is that FIG. 2 shows endpoint detection signal 270 as a time-voltage magnitude graph assuming a positive voltage level, which indicates that contact 260 is cleared of the dielectric. Whereas, FIG. 1 shows endpoint detection signal 170 assuming a low voltage level, indicating that contact 160 is not cleared of the dielectric.

FIG. 3A shows in graphical form the relationship between surface voltage 140 of FIG. 1 and selectable reference voltage 120 in an area of a semiconductor substrate that has not been completely etched, unetched area 180, and the relationship between surface voltage 240 of FIG. 2 and selectable reference voltage 120 in an area of a semiconductor substrate that has been completely etched, etched area 190. In the unetched area 180, which is related to FIG. 1, the etching process has not cleared dielectric 150 from contact site 160. As shown in FIG. 3A, in the unetched area 180, surface voltage 140 is greater than selectable reference voltage 120, and as shown in FIG. 3B, endpoint detection signal 170 is at a low level. In etched area 190, which is related to FIG. 2, the etching process has cleared dielectric 250 from contact site 260. Also, as shown in FIG. 3A, in etched area 190, surface voltage 240 is less than selectable reference voltage 120, and as shown in FIG. 3B endpoint detection signal 270 is at a high level. Endpoint detection signal 170 may be implemented in positive logic as in FIG. 3B or in negative logic, in which case the polarity of endpoint detection signal 170 is complemented.

In operation, surface voltage 140 and surface voltage 240 stabilize after the etching process completes. In some manufacturing process environments, stabilization occurs a few minutes after completion of the etching process, while in other environments stabilization may not occur for an hour or more after completion of the etching process. The actual stabilization time is determined empirically for each process etch step in the manufacturing of a particular product and may depend on environmental factors. After stabilization, system 100 measures surface voltage 140 as shown in FIG. 1 or surface voltage 240 as shown in FIG. 2. After the measurement is taken, system 100 compares the measured value to selectable reference voltage 120. Selectable reference voltage 120, of FIG. 2, is set to a value that can be obtained empirically and is related to the surface voltage 240 of the dielectric 250 when the contact site 260 is cleared of the dielectric. If the contact site 160, of FIG. 1, is not cleared of the dielectric, then, as illustrated in FIG. 1, the endpoint detection signal is maintained at a low level. If the contact site 260, of FIG. 2, is cleared of the dielectric, then, as illustrated in FIG. 2, the endpoint detection signal 270 assumes a high level, indicating that the dielectric etching process completed successfully. An advantage of system 100 is that at the completion of the dielectric etching process, system 100 makes determining the success or failure of the process relatively easy.

Figure 4:
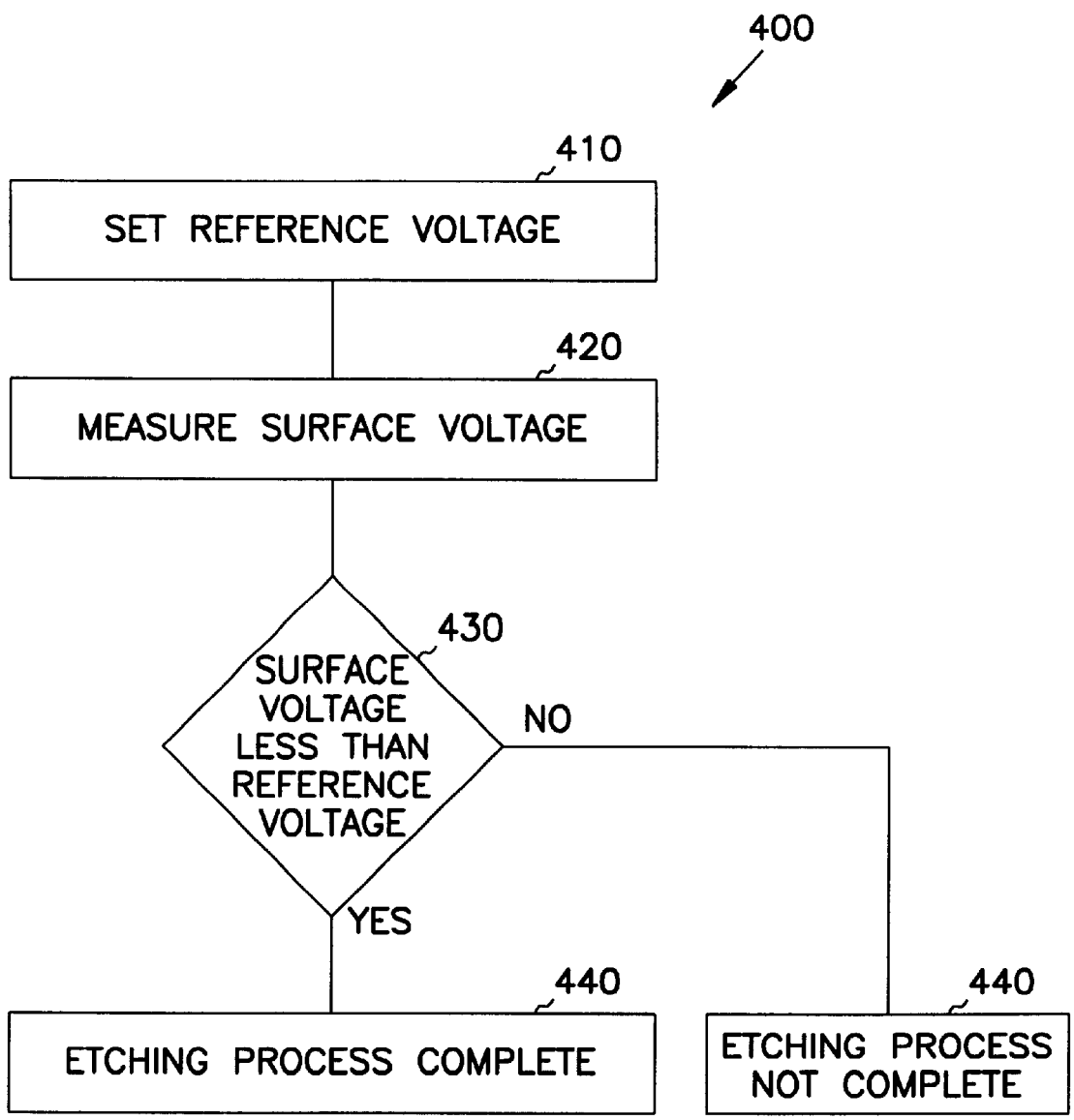
FIG. 4 is a general flow diagram of the endpoint detection process of the present invention.

An embodiment of a method in accordance with the present invention is shown in FIG. 4. Method 400 for identifying the completion of a dielectric etching process includes setting 410, measuring 420, comparing 430, and identifying 440 operations. In the setting 410 operation, a selectable reference voltage is set to a surface voltage value, which indicates that the dielectric at the contacts is cleared. In the measuring 420 operation, a voltage probe measures the surface voltage of the dielectric after the dielectric etching process in order to obtain the value of the surface voltage prior to the comparing 430 operation. The measuring 420 operation is preferably performed after the surface voltage has stabilized following the etching process. The surface voltage, after the etching process, is an indicator of whether the etching process completely etched the dielectric at the contact site. In the comparing 430 operation, the measured surface voltage is compared to the selectable reference voltage. And in the identifying 440 operation, when the measured voltage is less than the selectable reference voltage, an indicator of whether the dielectric etching process completed successfully is generated.

An advantage of this embodiment is that it can be tailored to dielectric etching steps at any point in the manufacturing process. This is accomplished by determining the reference voltage for a given process through measuring the surface voltage after the completion of the process and stabilization of the surface voltage, and by verifying that the contact site is cleared. One method of verifying that the contact site is cleared is to observe the contact site using a scanning electron microscope.

Figure 5:
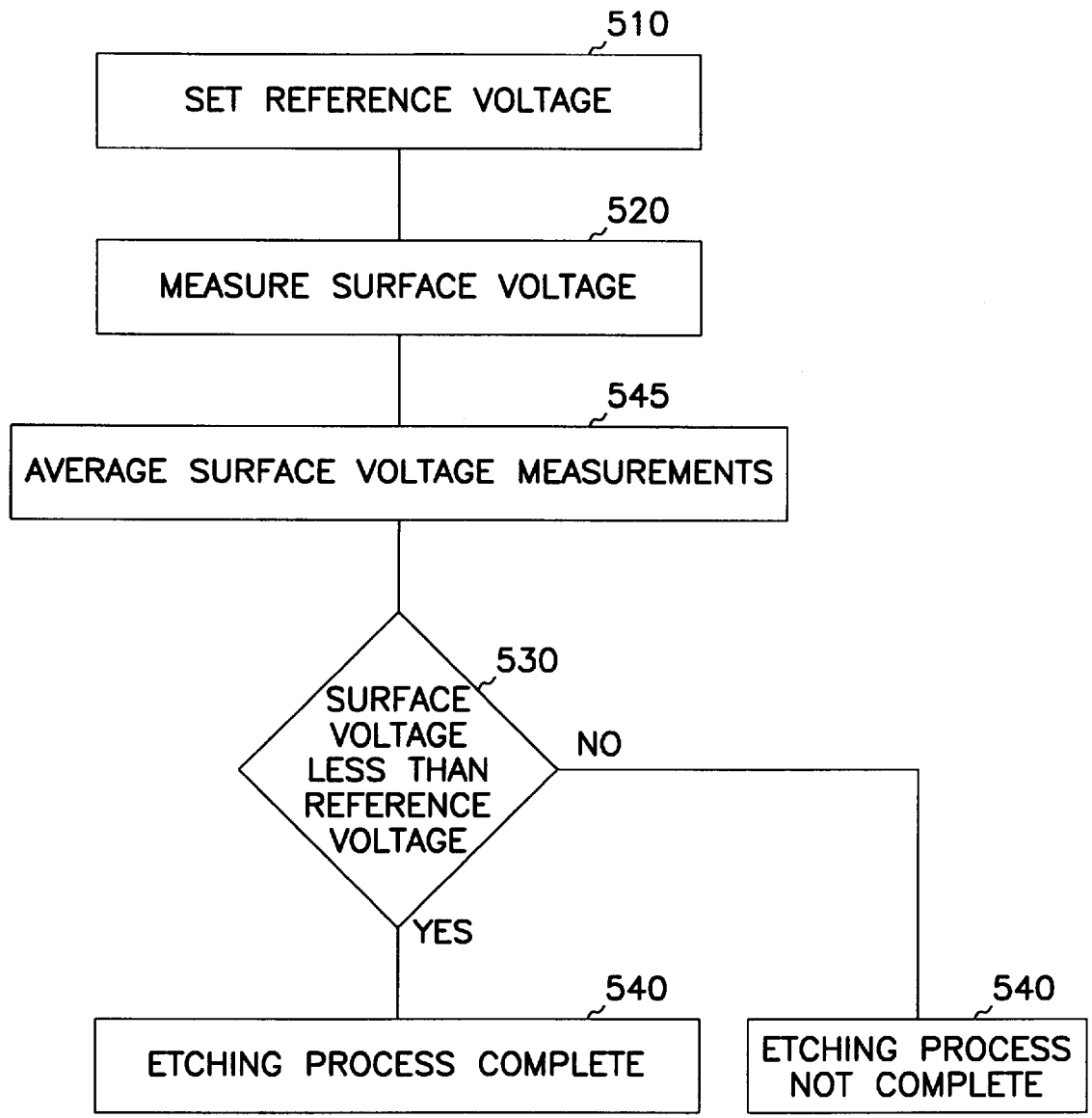
FIG. 5 is a general flow diagram of a second embodiment of the endpoint detection process of the present invention.

An alternate embodiment of the present invention is shown in FIG. 5. The method includes setting 510, measuring 520, averaging 545 comparing 530, and identifying completion 540 operations. As will be recognized by those skilled in the art, it is possible for a single measurement to be in error. So, for the purpose of increasing the accuracy and reliability of the measurement of the surface voltage, the embodiment shown in FIG. 5 adds the averaging 545 operation for averaging multiple surface voltage measurements. The number of measurements to average may be determined empirically using methods known in the art.

In another embodiment of the present invention, a further improvement in the surface voltage dielectric measurement process is achieved when the measurements are made at multiple locations on the dielectric. As will be appreciated by those skilled in the art, local process variations in the semiconductor manufacturing process are common and can be accounted for by making multiple measurements at different locations on the surface of the substrate.

Figure 6:
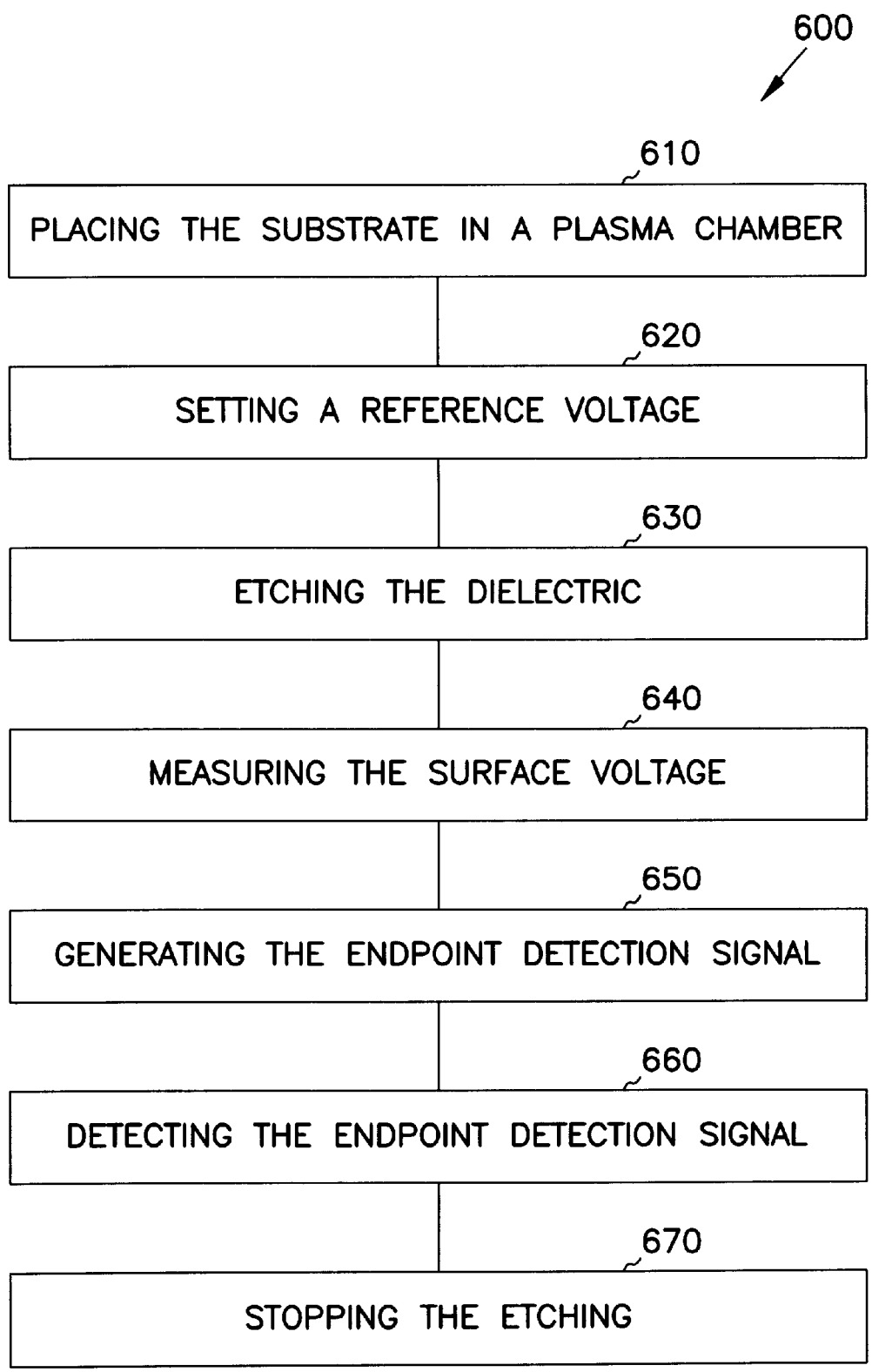
FIG. 6 is a general flow diagram of a method for real time detection of the endpoint of a dielectric etching process in a plasma environment of the present invention.

FIG. 6 shows a general flow diagram of method 600, a real time embodiment of the present invention. An advantage of the embodiment of method 600 is that time is not wasted making measurements after completion of the dielectric etching process. Method 600 comprises placing 610, setting 620, etching 630, measuring 640, generating 650, detecting 660, and stopping 670 operations.

Referring to FIG. 6, the placing 610 operation requires placing a substrate having a dielectric to etch within a plasma etch chamber. The setting 620 operation requires setting a selectable reference voltage as described in the previous embodiments of the invention. In one embodiment of the present invention, the selectable reference voltage is set to a value approximately equal to the surface voltage of the dielectric when a contact site is cleared of the dielectric. The etching 630 operation requires etching the dielectric in the plasma etch chamber. The measuring 640 operation requires measuring the surface voltage of the dielectric. Any method known to those skilled in the art for measuring a surface voltage in real time is suitable for use in connection with the present invention. The generating 650 operation requires generating an endpoint detection signal when the measured surface voltage is less than the selectable reference voltage. The endpoint detection signal is generated by a comparator as described in the previously described embodiments of the invention. The detecting 660 operation requires detecting the endpoint detection signal. In a positive logic system, the endpoint detection signal is detected by identifying the time when the endpoint detection signal goes positive. The stopping 670 operation requires stopping the etching process when the endpoint detection signal is detected. Purging the plasma chamber or removing the substrate from the plasma etch chamber stops the etching process.

Figure 7:
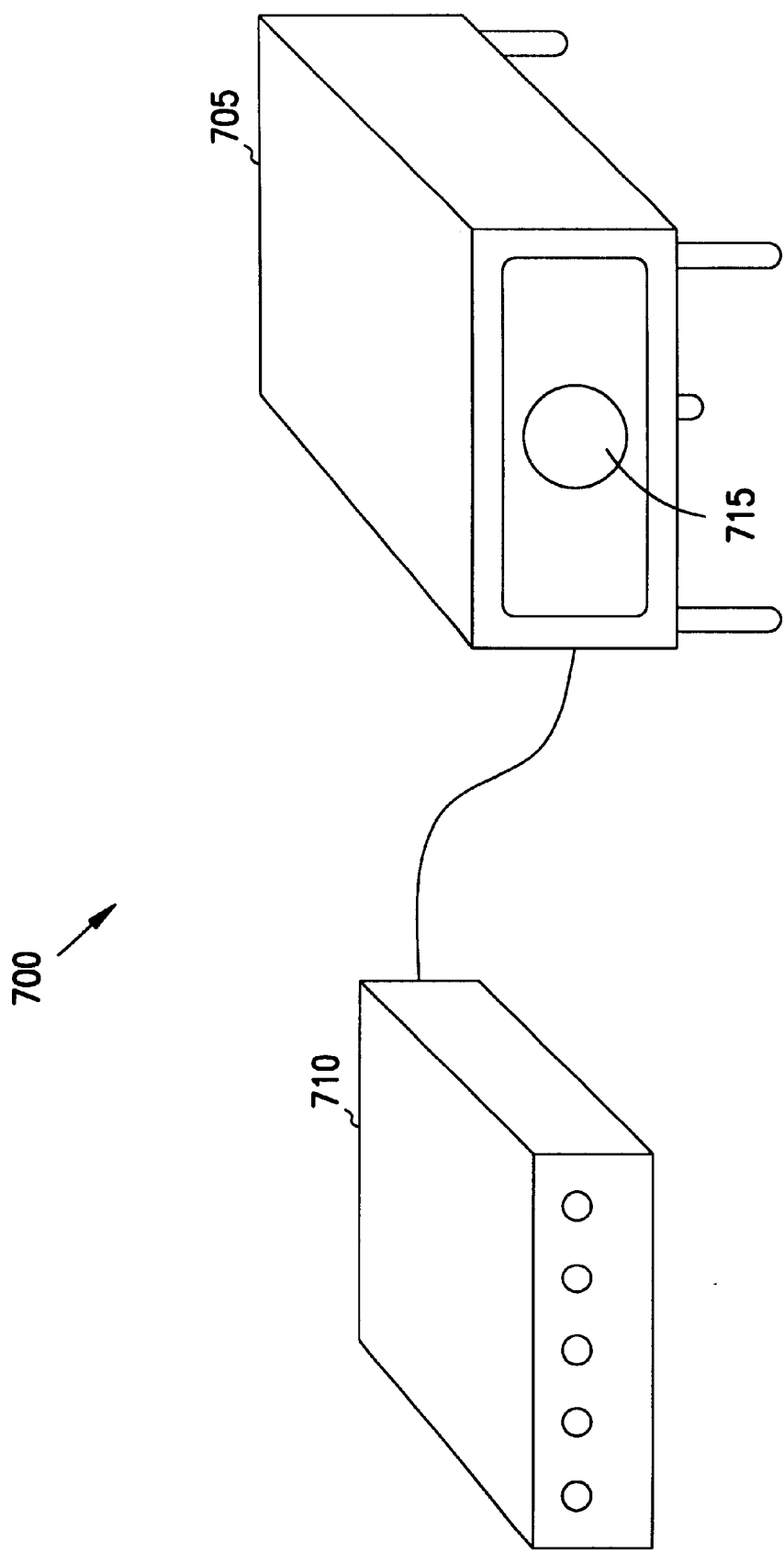
FIG. 7 is an illustration of a measurement system for measuring the surface voltage of a semiconductor substrate in a plasma etch chamber using a voltage probe.

FIG. 7 shows a measurement system 700 for measuring the surface voltage or a substrate current of substrate 715 in plasma etch chamber 705 using probe 710. The present invention can be practiced in connection with a variety of embodiments of probe 710. For example, in one embodiment, probe 710 is a voltage probe, in another embodiment probe 710 is a circuit capable of sensing current or the rate of change of a current signal, in still another embodiment probe 710 is an ammeter or a calibrated ammeter, and in yet another embodiment probe 710 is a computer system capable of measuring current or the rate of change of a current signal.

Various embodiments of processes and systems for measuring the surface voltage have been described above. Some of these processes and methods can be used in connection with the measurement of a surface voltage of semiconductor substrate 715. Measurement system 700 has the advantage that semiconductor substrate 715 is not removed from plasma etch chamber 705 before making a surface voltage measurement, and therefore reduces the overall manufacturing time for the substrate.

Figure 8A:
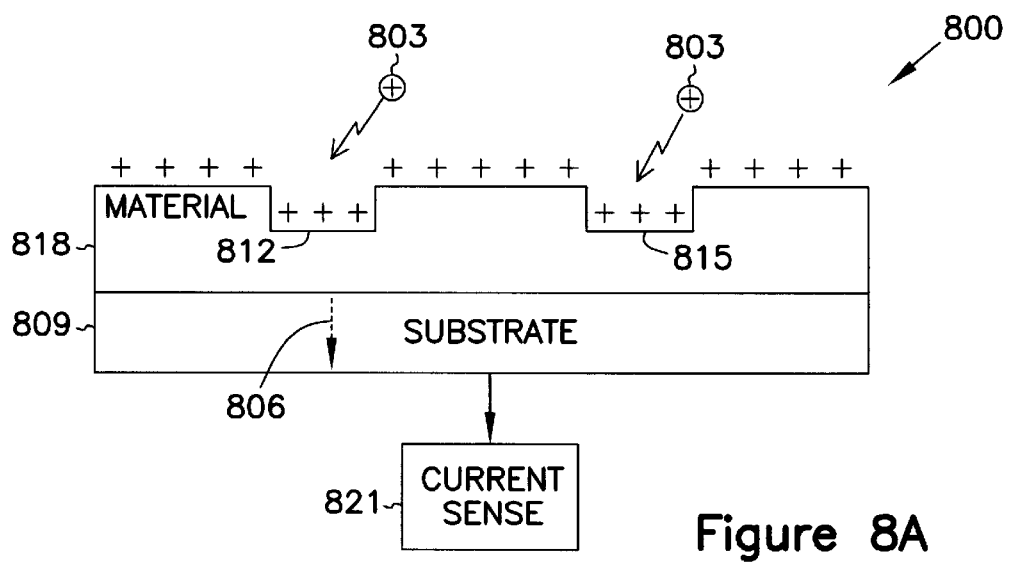
FIG. 8A is an illustration of a system for sensing a substrate current in a substrate having partially etched contacts.
Figure 8B:
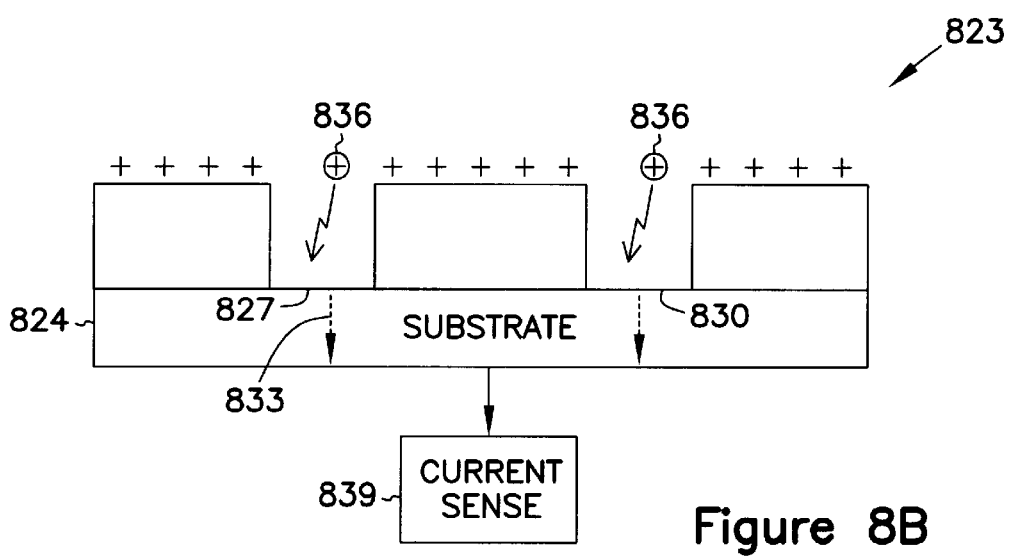
FIG. 8B is an illustration of a system for sensing a substrate current in a substrate having etched contacts.

Referring to FIG. 8A, in current sensing system 800, plasma ions 803 are capable of inducing a current 806 in substrate 809. Substrate 809 is not limited to a particular material. In one embodiment, substrate 809 is a semiconductor, such as silicon. In an alternate embodiment, substrate 809 is gallium arsenide. As long as the plurality of contacts, such as contact 812 and contact 815, are not cleared of material 818, current 806 is likely to be relatively small, in the range of picoamperes. Current 806 is sensed by current sense device 821, which can assume a variety of embodiments. For example, current sense device 821 can be a circuit, an ammeter, a calibrated ammeter, or a computer system capable of sensing current. Material 818 is generally a dielectric. Types of dielectrics suitable for use in connection with the present invention include oxides, nitrides, borophosphosilicate glasses (BPSG), silicon-dioxides, silicon-nitrides, and tetra-ethyl-ortho-silicates (TEOS). Referring to FIG. 8B, in current sensing system 823, as contacts 827 and 830 are cleared, substrate current 833, which is induced by plasma ions 836, increases to a relatively large value in the range of microamperes or milliamperes. This current can be measured using current sense device 839. In one embodiment, current sense device 839 is a circuit. In another embodiment, current sense device 839 is an ammeter. In yet another embodiment, current sense device 839 is a computer system capable of sensing current.

Figure 8C:
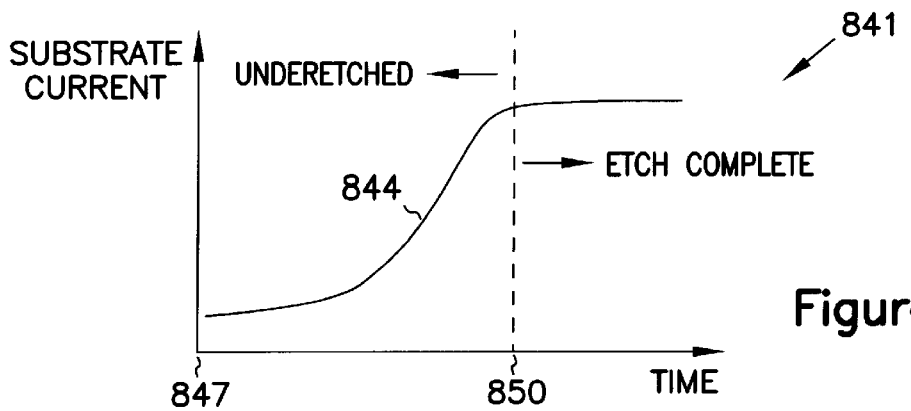
FIG. 8C is an graph of a substrate current versus time for a plasma etch process of a substrate.

Referring to FIG. 8C, a substrate current versus time graph 841 shows the increase in current along line 844 as time changes from the beginning of an etch process at time zero 847 until etch finish time 850. At etch finish time 850, the rate of change of the current approaches zero. In one embodiment of the present invention, this rate of change is detected to identify etch finish time 850. In an alternate embodiment, etch finish time 850 is detected by empirically determining the current value at which the etch process is complete. Substrate current at etch process time zero 847 is on the order of picoamperes and at etch finish time 850 substrate current is on the order of microamperes or milliamperes. As described above, the substrate current value at etch finish time 850 is determined by etching a substrate, measuring the substrate current, and verifying that the contacts are cleared using a scanning electron microscope.

It is to be recognized that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

CONCLUSION

The identification by the applicant of the relationship between the dielectric etching process and the surface voltage, and the real time relationship between the dielectric etching process and the substrate current, permits the above described embodiments of the present invention. The embodiments exploit the process insight that as a contact site is cleared of dielectric, the surface voltage of the dielectric decreases, and that in real time as a contact site is cleared of dielectric, the substrate current increases.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A system for identifying completion of a dielectric etching process on a semiconductor substrate having a dielectric, and the dielectric having a surface voltage, the system comprising:
   a voltage probe for measuring the surface voltage of the dielectric to produce a measured voltage; and
   an electronic comparator for comparing the measured voltage to a reference voltage.

2. The system of claim 1, wherein the voltage probe is a non-contact probe.

3. The system of claim 1, wherein the electronic comparator is an analog comparator.

4. The system of claim 1, wherein the electronic comparator is a digital comparator.

5. The system of claim 1, wherein the reference voltage is set to a value approximately equal to the surface voltage of the dielectric when the contact is cleared of the dielectric.

6. A system for identifying completion of a dielectric etching process comprising:
   a plasma etch chamber;
   a semiconductor substrate having a dielectric, the dielectric having a surface voltage, and
   the substrate is located in the plasma etch chamber;
   a voltage probe for measuring the surface voltage to produce a measured voltage; and
   an electronic comparator for comparing the measured voltage to a reference voltage.

7. The system of claim 6 wherein the voltage probe is a non-contact probe.

8. The system of claim 6, wherein the electronic comparator is an analog comparator.

9. The system of claim 6, wherein the electronic comparator is a digital comparator.

10. The system of claim 6, wherein the reference voltage is set to a value approximately equal to the surface voltage of the dielectric when the contact is cleared of the dielectric.

11. A system for identifying completion of an etching process comprising:
    a plasma etch chamber;
    a substrate in the plasma etch chamber; and
    a circuit coupled to the substrate and operable for identifying when a substrate current exceeds a particular value.

12. The system of claim 11, wherein the particular value is the substrate current at a time when a plurality of contacts is cleared.

13. The system of claim 11, wherein the circuit is capable of operating during a plasma etching process.

14. A system for identifying completion of an etching process comprising:
    a plasma etch chamber;
    a substrate having a material layer having a plurality of contacts, the substrate is located inside the plasma etch chamber; and
    a circuit coupled to the substrate and operable for identifying when a substrate current exceeds a particular value.

15. The system of claim 14, wherein the particular value is a value of the substrate current at a time when the plurality of contacts is cleared of the material.

16. A system for identifying completion of an etching process comprising:
   a plasma etch chamber;
   a substrate having a material layer having a plurality of contacts, the substrate is located inside the plasma etch chamber; and
   an ammeter coupled to the substrate and calibrated to indicate a substrate current at which the etching process is complete.

17. The system of claim 16, wherein the ammeter is calibrated to indicate the substrate current at which the plurality of contacts is cleared of the material.

18. A system for identifying completion of an etching process comprising:
   a plasma etch chamber;
   a substrate having a material layer having a plurality of contacts, the substrate is located inside the plasma etch chamber; and
   a computer system coupled to the substrate and operable for identifying when a substrate current exceeds a reference current.

19. The system of claim 18, wherein the reference current is the substrate current at which the plurality of contacts is cleared of the material.

20. A system for identifying completion of a dielectric etching process comprising:
   a plasma etch chamber;
   a substrate having a dielectric layer having a plurality of contacts, the substrate is located inside the plasma etch chamber; and
   a circuit coupled to the substrate and operable for identifying when a substrate current exceeds a particular value.

21. The system of claim 20, wherein the particular value is the substrate current at which the plurality of contacts is cleared of the dielectric.

22. A system for identifying completion of a dielectric etching process comprising:
   a plasma etch chamber;
   a substrate having a dielectric layer having a plurality of contacts, the substrate is located inside the plasma etch chamber; and
   an ammeter coupled to the substrate and calibrated to indicate a substrate current at which the dielectric etching process is complete.

23. The system of claim 22, wherein the ammeter is calibrated to indicate the current at which the plurality of contacts is cleared of the dielectric.

24. A system for identifying completion of a dielectric etching process comprising:
   a plasma etch chamber;
   a substrate having a dielectric layer having a plurality of contacts, the substrate is located inside the plasma etch chamber; and
   a computer system coupled to the substrate and operable for identifying when a substrate current exceeds a particular value.

25. The system of claim 24, wherein the particular value is the substrate current at which the plurality contacts is cleared of the dielectric.

* * * * *